United States Patent
Sullivan et al.

(10) Patent No.: US 6,608,789 B2
(45) Date of Patent: Aug. 19, 2003

(54) HYSTERESIS REDUCED SENSE AMPLIFIER AND METHOD OF OPERATION

(75) Inventors: Steven C. Sullivan, Austin, TX (US); Perry H. Pelley, Austin, TX (US); George P. Hoekstra, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 27 days.

(21) Appl. No.: 10/027,547

(22) Filed: Dec. 21, 2001

(65) Prior Publication Data

US 2003/0117873 A1 Jun. 26, 2003

(51) Int. Cl.⁷ .................................................. G11C 7/00
(52) U.S. Cl. ..................... 365/205; 365/203; 365/207; 327/51; 327/52; 327/55
(58) Field of Search .................................. 365/205, 207, 365/203; 327/55, 52, 51

(56) References Cited

U.S. PATENT DOCUMENTS

| | | | |
|---|---|---|---|
| 5,646,900 A | * | 7/1997 | Tsukude et al. ............ 365/205 |
| 6,154,091 A | | 11/2000 | Pennings et al. |
| 6,222,394 B1 | | 4/2001 | Allen et al. |
| 6,261,879 B1 | * | 7/2001 | Houston et al. ............ 438/154 |
| 6,433,589 B1 | * | 8/2002 | Lee ............................. 326/115 |
| 6,466,499 B1 | * | 10/2002 | Blodgett ..................... 365/207 |

OTHER PUBLICATIONS

Jente B. Kuang et al., "Dynamic Body Charge Modulation for Sense Amplifiers in Partially Depleted SOI Technology", IEEE Journal of Solid–State Circuits, vol. 36, No. 4, Apr. 2001, pp. 597–603.

* cited by examiner

Primary Examiner—Richard Elms
Assistant Examiner—Toan Le
(74) Attorney, Agent, or Firm—Robert L. King; Joanna G. Chiu

(57) ABSTRACT

A sense amplifier (40) uses a body shorting device (60) to selectively electrically short circuit the bodies of two transistors (44, 48) that function as a differential sensing pair. Equalization of charge injected into the bodies functions to minimize offset voltage between the two bodies. The body shorting device selectively shorts the bodies in response to a body control signal after a sense operation and after asserting a precharging signal to initiate precharging of the sense amplifier's outputs.

20 Claims, 3 Drawing Sheets

HYSTERESIS REDUCED SENSE AMPLIFIER AND METHOD OF OPERATION

FIELD OF THE INVENTION

This invention relates generally to semiconductor memories, and more specifically, to sense amplifiers used in semiconductor memories.

BACKGROUND OF THE INVENTION

Sense amplifiers are used in conjunction with memories such as, for example, a static random access memory array (SRAM), a dynamic random access memory (DRAM) or a read only memory (ROM). Sense amplifiers function to detect when bit lines in a memory array exhibit a voltage transition in response to column and row decoding and a sense enable signal. In such memories, there is a need to amplify and decode signals provided via columns of memory cells.

It is desirable to sense a data signal with an amplifier containing a cross-coupled differential pair of transistors. The timing of turn-on of the sense amplifier is critical. One measure of a sense amplifier's quality is the minimum differential signal that the sense amplifier is able to accurately sense. An objective in sense amplifier design is to provide the maximum differential signal to the difference in gate-to-source drive (delta $V_{GS}$) of the differential cross-coupled pair. Another critical design parameter associated with sense amplifiers is associated with the operation of a differential cross-coupled pair of transistors. The design parameter involves insuring that the difference in gate-to-source drives is greater than zero at the time the pair is clocked. If not, the output signal may not be accurate. In general, prior sense amplifiers have involved a trade-off between speed, size and power consumption.

One transistor implementation of memories is the use of silicon on insulator (SOI) processing in which a transistor is formed on an insulating material. A characteristic of a transistor formed with an SOI process is an isolated portion of the device that exists between the current conducting electrodes and below a control electrode. This portion of the transistor is commonly referred to as the "body" of the transistor and is the portion where current conduction occurs between the current conducting electrodes. The body is otherwise electrically isolated and is frequently not electrically contacted. However, simply allowing non-contacted bodies to electrically float makes the voltage associated with the body to be vulnerable to noise, leakage currents and other process variations. Voltage variations of the body cause numerous detrimental characteristics for a memory sense amplifier. For example, the body voltage variation affects the transistor threshold voltage. The amount of voltage variation is dependent upon the previous switching history of the transistor and is therefore data dependent. The reason this matters is that any offset in the sense amplifier is effectively subtracted from the bit line signal to be detected by the sense amplifier. In other words, the signal to noise ratio is reduced. For memory sense amplifiers where small differential voltages are being sensed and accurate threshold voltages are important, the body voltage variation is very problematic. One technique that has been used to minimize such disadvantages is to connect the bodies of transistors used in memory sense amplifiers to a ground potential. However, the resistance of the body contacts is large and the body often does not have time to be equalized to ground potential when very short memory cycle times are used. Because there is a relatively large voltage potential difference between the bodies of the differential pair in a sense amplifier, the voltages are not equalized at high frequencies.

Another known technique that has been used to minimize such disadvantages is to connect the bodies of a differential pair of sensing transistors in a sense amplifier together. However, when the bodies are connected together, a voltage gradient builds up in the bodies due to the lack of the ability to create a low resistance connection. Also, due to the resistance and capacitive coupling effects of the body, a relatively large time constant exists when trying to equalize the voltages of the bodies.

Yet another known technique that has been used to minimize such disadvantages is to connect the body to the source of each transistor of a differential pair of sensing transistors in a sense amplifier. The resistance of the body contacts is large and the body often does not have time to be equalized to the source when very short memory cycle times are used. Therefore, there is no ability for the electrical connection to fully discharge the body of either transistor of the differential pair of sensing transistors to ground.

BRIEF DESCRIPTION OF THE DRAWINGS

The present invention is illustrated by way of example and is not limited by the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
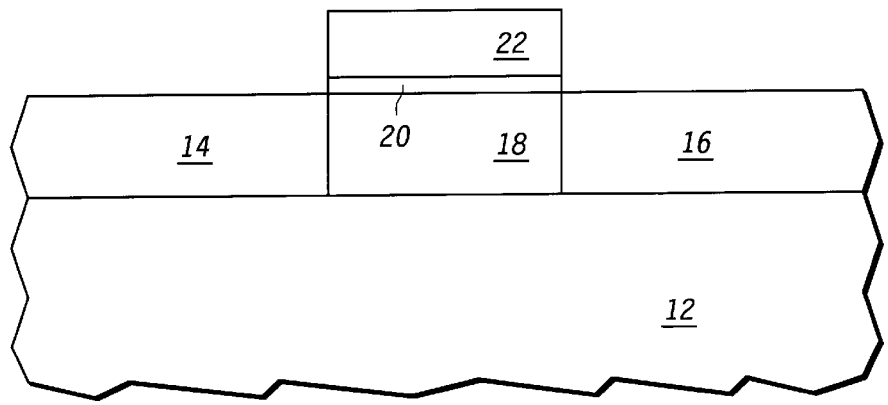
FIG. 1 illustrates a cross section of an SOI transistor having a floating body.

FIG. 1 illustrates a body isolated transistor 10 generally having an insulator 12, a source 14, a drain 16, a body 18, an insulator 20 and a gate 22. The source 14, body 18 and drain 16 adjoin insulator 12, and body 18 physically separates source 14 from drain 16. Insulator 20 separates gate 22 from body 18. Electrical contacts to each of source 14, drain 16 and gate 22 are implied but not expressly shown. In the illustrated form, body 18 is electrically isolated from external contact. Because source 14, drain 16, body 18 and gate 22 may be formed of silicon, one common term for the illustrated structure is 'silicon on insulator' or SOI. It should be well understood that underlying insulator 20 is a substrate (not shown) of other material.

Figure 2:
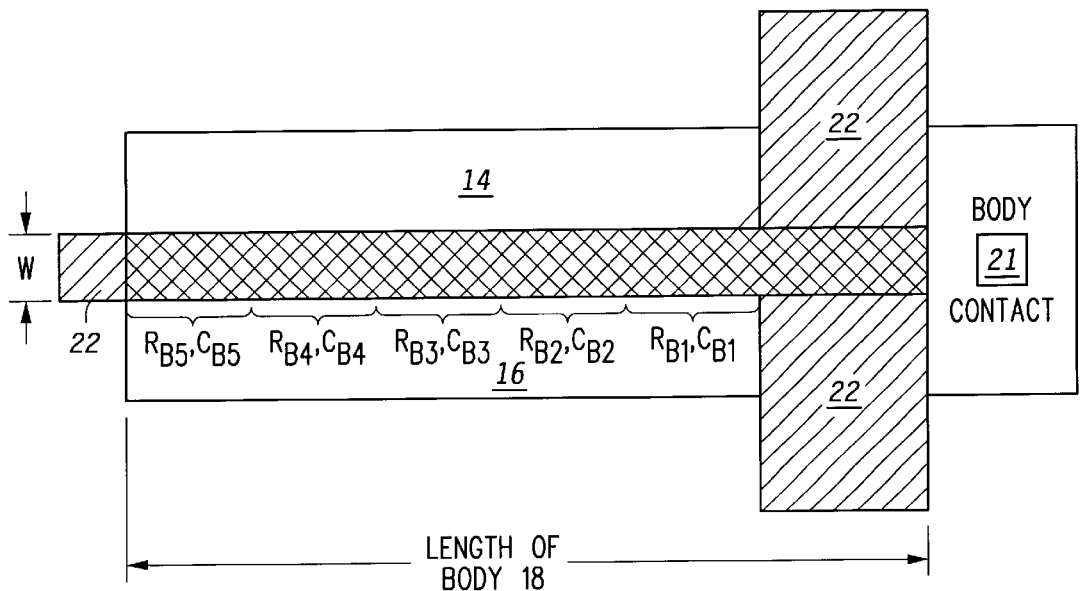
FIG. 2 illustrates a top plan view of a body contacted SOI transistor illustrating the distributed resistive/capacitive characteristic of the body.

FIG. 2 illustrates a top view of a body isolated transistor such as transistor 10 of FIG. 1. Common elements between FIG. 1 and FIG. 2 are similarly numbered. The source 14 is separated from drain 16 via the gate 22. Gate 22 is represented by a cross hatching running from the bottom left of the drawing to upper right. Gate 22 overlies body 18 in areas that are represented in both directions. A body contact 21 is extended beyond the structure for making electrical contact to underlying body 18. The length of body 18 is illustrated and has a high resistance. The resistance of body 18 is determined by the resistivity of the material, rho, multiplied by the ratio of the length divided by the width of body 18. As a result of both the small width in relation to the long length and the high resistivity of the body, the resistance of the body 18 is high. This resistance is represented along five equal portions of underlying body 18 as Rb. Additionally, along each of the five portions of the underlying body 18 there is a drain-to-body capacitance, Cb. The effect of the cumulative Rb resistances and Cb capacitances is to create a significant delay in transferring charge within body 18.

Figure 3:
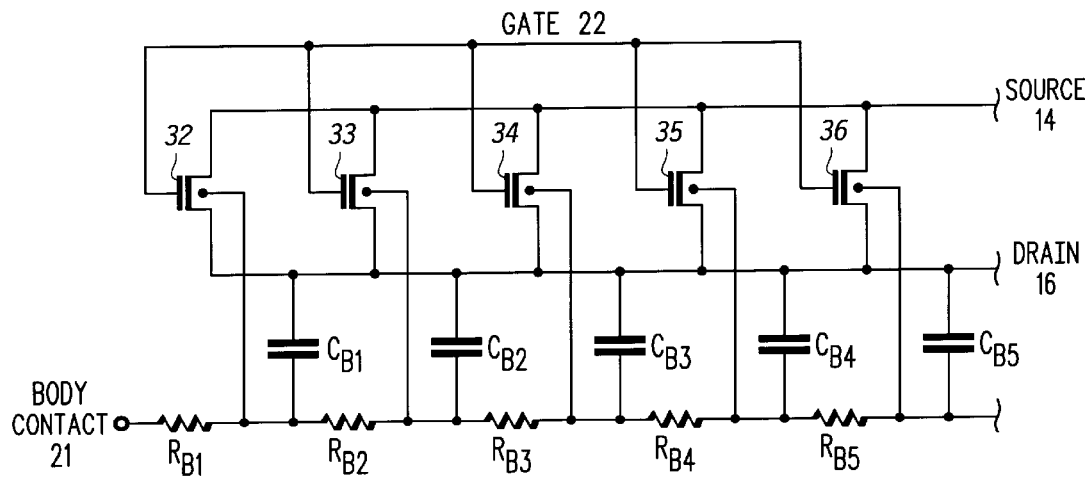
FIG. 3 illustrates in schematic form an equivalent circuit of the high resistance portion of the body of the transistor of FIG. 2.

Illustrated in FIG. 3 is a schematic representative circuit 30 of the capacitive and resistive elements associated with body 18 of FIG. 2. For purposes of comparison, common elements shared between FIGS. 1–3 are numbered the same. The equivalent circuit of FIG. 2 represents a single transistor that is divided into five separate portions to further illustrate the net ohmic nature of body 18. Source 14 is illustrated as connected to a plurality of source electrodes of N-channel transistors 32–36. A gate of each of N-channel transistors 32–36 is connected together to form gate 22. A drain of each of N-channel transistors 32–36 is connected together to form drain 16. The individual resistive elements Rb of body 18 are connected in series to body contract 21. Similarly, the individual drain-to-body capacitances Cb of body 18 are distributed between the various portions of body 18 to the body contact 21.

Figure 4:
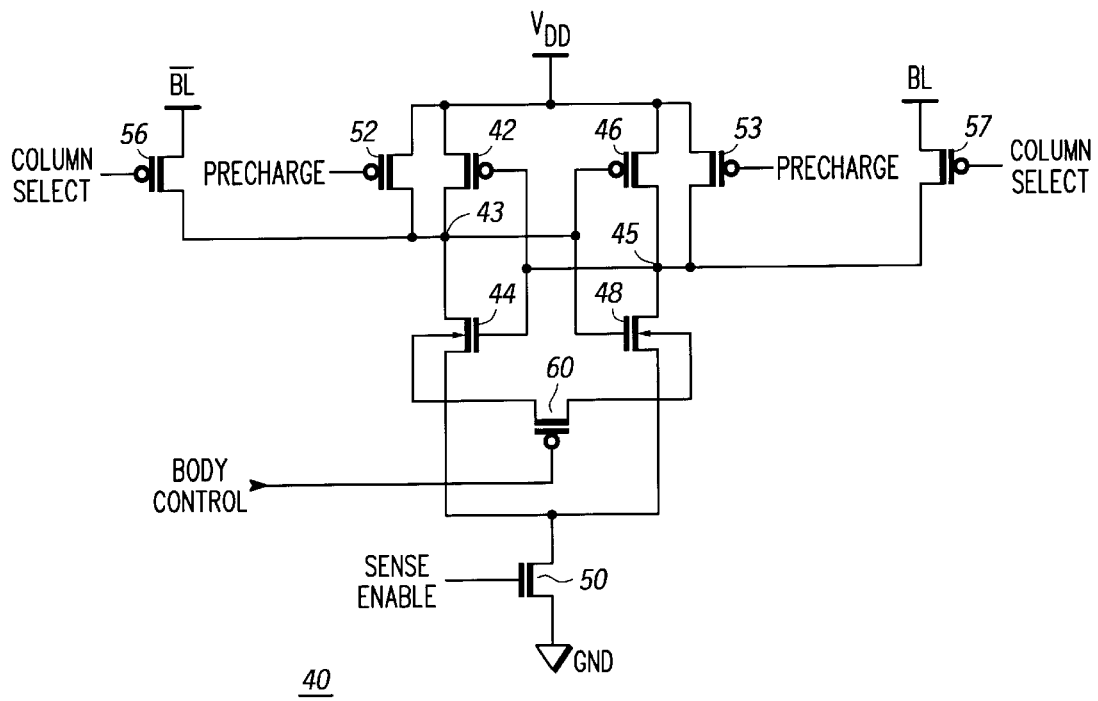
FIG. 4 illustrates in schematic form a sense amplifier in accordance with the present invention.

Illustrated in FIG. 4 is a hysteresis reduced sense amplifier 40 in accordance with one form of the present invention. A P-channel transistor 42 has a source connected to a power supply terminal for receiving a power supply voltage labeled Vdd. A drain of transistor 42 is connected to a first sense input/output (I/O) 43 and to a drain of an N-channel transistor 44. A gate of transistor 42 is connected to a gate of transistor 44 at a second sense input/output (I/O) 45. Because first sense input/output 43 and second sense input/output 45 are differential outputs, the two signals represent true and complement signals. As illustrated, second sense input/output 45 is a true input/output and first sense input/output 43 is a complementary input/output. A P-channel transistor 46 has a source connected to the Vdd power supply terminal, a gate connected to the first sense input/output 43 and a drain connected to the second sense input/output 45. A drain of an N-channel transistor 48 is connected to the drain of transistor 46 at the second sense input/output 45, and a source of transistor 48 is connected to a source of transistor 44 and to a drain of an N-channel transistor 50. A gate of transistor 48 is connected to the first sense input/output 43. A gate of transistor 50 is connected to a Sense Enable signal. A source of transistor 50 is connected to a ground terminal labeled Gnd. A P-channel transistor 52 has a source connected to the Vdd power supply terminal, a gate for receiving a Precharge signal, and a source connected to the first sense input/output 43. A P-channel transistor 53 has a source connected to the Vdd power supply terminal, a gate for receiving the Precharge signal, and a source connected to the second input/output 45. A P-channel transistor 56 has a source connected to a complement bit line, BL-bar, a gate connected to a Column Select signal, and a drain connected to the first sense input/output 43. A P-channel transistor 57 has a source connected to a bit line, BL, a gate connected to the Column Select signal, and a drain connected to the second sense input/output 45. A body shorting device 60 is implemented, in one form, as a P-channel transistor having a first current electrode (source or drain) connected to the body of transistor 44, a second current electrode (drain or source) connected to the body of transistor 48, and a gate connected to a control signal labeled Body Control.

Figure 5:
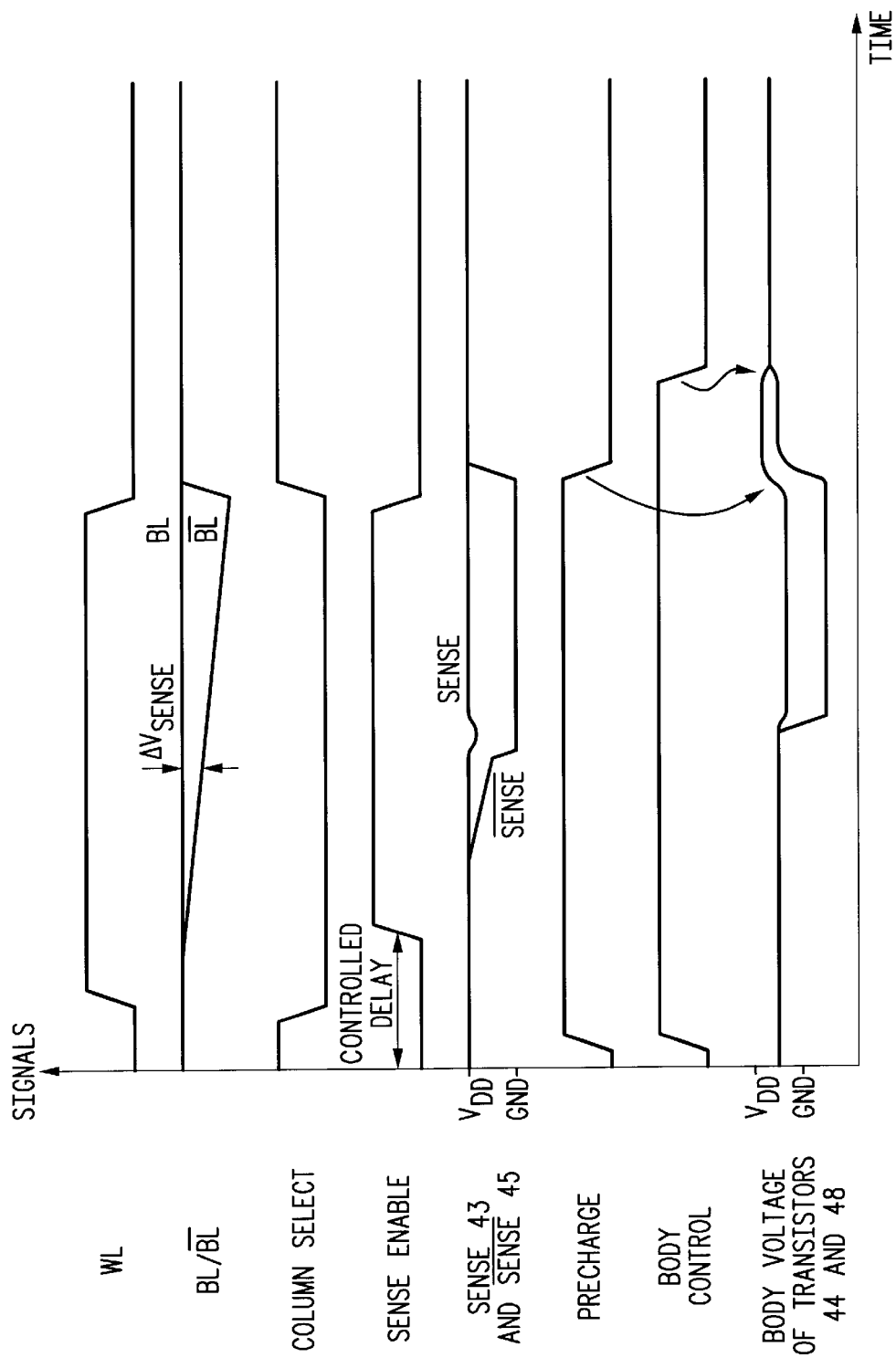
FIG. 5 illustrates in graphical form signal waveforms associated with the sense amplifier of FIG. 4.

The operation of sense amplifier 40 may be more readily understood in connection with reference to the waveforms of FIG. 5. The Column Select signal is made active to couple a bit line and a bit line-bar to sense amplifier 40. Initially, a Precharge signal is asserted during a precharge phase to make transistors 52 and 53 conductive and thereby place first sense input/output 43 and second sense input/output 45 at a predetermined voltage level, such as supply voltage Vdd. During the precharge phase, the isolated body voltage of transistor 44 reaches a first voltage level and the isolated body voltage of transistor 46 reaches a second voltage level different from the first voltage level. As illustrated, the Precharge signal is deasserted to make transistors 52 and 53 nonconductive and allow first and second sense inputs/outputs 43 and 45 to form a differential voltage. This operation initiates a memory access, such as a Read access. During a read access, transistors 44 and 48 function as a cross-coupled differential pair of sensing transistors. Asserting the Body Control signal at the same time, or substantially close in time, makes transistor 60 nonconductive.

Shortly thereafter, a sense amplifier wordline signal, WL, transitions from an inactive (low in the illustrated form) state to an active state. The wordline signal functions in a conventional manner to select a plurality of bit lines from an array of bit lines. Because the wordline selection used herein is conventional, details of the wordline operation are not shown in FIG. 4. In response to the wordline signal being active, the Bit line, BL, and complement Bit line, BL-bar, signals begin to transition in a conventional manner. For purposes of explanation only, the BL-bar is selected as transitioning low while the BL signal remains near Vdd. During this time, assertion of a Sense Enable signal is being delayed a sufficient amount of time to permit enough differential signal to be created between sense input/output 43 and sense input/output 45 to permit sense amplifier 40 to properly resolve when enabled. The Column Select signal is made inactive at or close in time when the Sense Enable signal is asserted. In other words, the Column Select signal is turned off when a sense operation occurs. When the Sense Enable is asserted, the Sense inputs/outputs 43 and 45 are separated while transistors 56 and 57 are nonconductive, thereby isolating sense amplifier 40 from the bit line and bit line-bar.

The sense Enable signal latches the sense inputs/outputs 43 and 45 to the full supply rails, Vdd and ground. This latching results in differential capacitive coupling to the isolated bodies of transistors 44 and 48. After sensing is complete, the sense inputs/outputs 43 and 45 are precharged back to Vdd as a result of asserting the Precharge signal. The precharge action of the Sense outputs couples charge into the body of transistors 44 and 48. This charge is nearly the same as the charge that was coupled into the body of transistors 44 and 48 during latching, but is now removed from the isolated bodies. During the circuit operation description herein, the Body Control signal has to this point been negated. After waiting for the outputs to fully precharge, the Body Control signal is asserted, thereby making transistor 60 conductive. Transistor 60 functions to equalize any errors in the charging and discharging of the isolated bodies. Transistor 60 substantially equalizes a first body voltage of transistor 44 and a second body voltage of transistor 48. Transistor 60 thereby removes any differential voltage existing between the isolated bodies of transistors 44 and 48. Otherwise, a differential voltage in the isolated bodies will build up and have a hysteresis effect for any following accesses of the sense amplifier 40. The use of transistor 60 to electrically short circuit the isolated bodies has minimized hysteresis and removed dependency from the previous switching history of sense amplifier 40. Transistor 60 distributes the mismatched charges in the isolated bodies of transistors 44 and 48 within a predetermined amount of time. The required amount of time is small because the error to be corrected is small. Equalization in a conventional sense amplifier occurs primarily by normal operation coupling action. However, a short timed pulse completes the equalization process such as for example during a write mode and non-active states. In one form, the predetermined amount of time occurs between read accesses to the sense amplifier 40. The cross-coupled isolated body transistors 44 and 48 provide an amplified output signal (true and complement versions as a result of the differential sensing) at the sense input/output 43 and 45, respectively.

It should be noted that transistor 60 was not made conductive until completion of a full cycle in which charge is transferred into and out of the bodies of transistors 44 and 48. Transistor 60 is only necessary to equalize any errors in the charge cycled.

By now it should be appreciated that there has been provided a sense amplifier that fulfills a need for equalized bodies in differential pair sense amplifiers. The equalizing is accomplished just prior to sensing and does not interfere with a natural coupling of charge into and out of the floating bodies of the sensing transistors. By allowing a full cycle of sense and precharge, the charge in the bodies of the differential pair transistors is restored very close to its initial state before sensing, thereby minimizing hysteresis effects created by floating bodies. Any errors due to process mismatches are equalized with the use of transistor 60 and the Body control signal. The equalization may be performed quickly because of the error voltages are small due to the fact that the charge was restored.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

In the foregoing specification, the invention has been described with reference to specific embodiments. However, one of ordinary skill in the art appreciates that various modifications and changes can be made without departing from the scope of the present invention as set forth in the claims below. For example, multiple sense amplifiers may be used in connection with the same shorting device transistor 60 in which the current electrodes of shorting device transistor 60 would be connected to other differential sensing pair(s) of transistors (not shown). Sense amplifier circuitry may be modified to use in conjunction with the present invention. As a further example, the present invention applies to various memories, such as MRAMs. Although memory bit line potentials may vary, the present invention is equally applicable for all voltage applications. Any semiconductor with a floating body may use the present invention; therefore semiconductors of materials other than silicon may be used. Additionally, MOS implementations using either P-channel transistors or N-channel transistors may be used, Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. Sense amplifier circuitry, comprising:
   a plurality of body isolated transistors coupled to provide differential sensing; and
   control circuitry having a first terminal coupled to a first body portion of one of the plurality of body isolated transistors, a second terminal coupled to a second body portion of another one of the plurality of body isolated transistors, and a third terminal for receiving a body control signal, the control circuitry selectively coupling the first and second body portions together to charge share by distributing mismatched charges in the first and second body portions in response to the body control signal, the control circuitry thereby substantially equalizing body voltage of the first and second body portions to a voltage between a differential voltage in the first and second body portions.

2. The sense amplifier circuitry of claim 1, wherein the control circuitry comprises a transistor, the transistor having a first current electrode coupled to the first terminal, a second current electrode coupled to the second terminal, and a control electrode coupled to the third terminal.

3. The sense amplifier circuitry of claim 1, wherein the control circuitry couples the first body portion and the second body portion.

4. Sense amplifier circuitry, comprising:
   a first input/output node for receiving a first input signal;
   a first isolated body transistor coupled to the first input/output node;
   a second input/output node for receiving a second input signal;
   a second isolated body transistor cross-coupled to the first isolated body transistor and coupled to the second input/output node, the first isolated body transistor and the second isolated body transistor coupled to provide an amplified output signal at the first input/output node and the second input/output node; and
   a body shorting device coupled between the first isolated body transistor and the second isolated body transistor, the body shorting device being responsive to a body control signal, wherein the body shorting device selectively electrically short circuits a body portion of the first isolated body transistor to a body portion of the second isolated body transistor to substantially equalize body voltage of the first isolated body transistor and the second isolated body transistor to a voltage between a differential voltage in the body portion of the first isolated body transistor and the second isolated body transistor.

5. The sense amplifier circuitry of claim 4, wherein when the body control signal is asserted, the body shorting device electrically short circuits the body portion of the first isolated body transistor to the body portion of the second isolated body transistor.

6. The sense amplifier circuitry of claim 5, wherein the body control signal is asserted in response to the first and second input/output nodes being charged to a predetermined charge level.

7. The sense amplifier circuitry of claim 6, wherein the predetermined charge level corresponds to a precharge voltage potential.

8. The sense amplifier circuitry of claim 4, wherein the body shorting device comprises a transistor selected from a group consisting of an N-channel transistor and a P-channel transistor.

9. The sense amplifier circuitry of claim 8, wherein the transistor comprises:
- a first current electrode connected to the body portion of the first isolated body transistor;
- a second current electrode connected to the body portion of the second isolated body transistor; and
- a control electrode for receiving the body control signal.

10. The sense amplifier circuitry of claim 4, wherein each of the first isolated body transistor and the second isolated body transistor comprises an N-channel transistor or a P-channel transistor.

11. Sense amplifier circuitry, comprising:
- a cross-coupled differential sensing pair of isolated body transistors, each of the pair of isolated body transistors having a body portion to provide body portions susceptible to mismatched charges; and
- control circuitry for distributing the mismatched charges of the body portions between each of the pair of isolated body transistors by substantially equalizing a first body voltage and a second body voltage to a voltage between a differential of the first body voltage and the second body voltage.

12. The sense amplifier circuitry of claim 11, wherein the control circuitry further comprises a single transistor that selectively directly connects each body portion of the pair of isolated body transistors.

13. The sense amplifier circuitry of claim 11, wherein the control circuitry distributes the mismatched charges within a predetermined amount of time.

14. The sense amplifier circuitry of claim 13, wherein the predetermined amount of time occurs between read accesses to the sense amplifier circuitry.

15. The sense amplifier circuitry of claim 11, wherein the control circuitry comprises at least one of an N-channel transistor and a P-channel transistor coupled between the body portions of the isolated body transistors in the pair of isolated body transistors.

16. A method for operating a sense amplifier having a first input/output node, a second input/output node, a first isolated body transistor cross coupled to a second isolated body transistor to provide differential sensing at the first and second input/output nodes, the first isolated body transistor having a first body voltage and the second isolated body transistor having a second body voltage, the method comprising:
- sensing a read access to the sense amplifier;
- asserting a precharge signal;
- in response to asserting the precharge signal, precharging the first and second input/output nodes to a predetermined voltage level, wherein the first body voltage reaches a first voltage level and the second voltage reaches a second voltage level, different from the first voltage level;
- asserting a body control signal after asserting the precharge signal; and
- in response to asserting the body control signal, connecting a body portion of the first isolated body transistor to a body portion of the second isolated body transistor to equalize the first body voltage and the second body voltage to a voltage between the first body voltage and the second body voltage.

17. The method of claim 16, further comprising:
- equalizing the first body voltage and the second body voltage by enabling a single transistor to connect the body portion of the first isolated body transistor to the body portion of the second isolated body transistor response.

18. The method of claim 16, wherein the body control signal is asserted at a predetermined amount of time after asserting the precharge signal.

19. The method of claim 18, wherein the body control signal is asserted after precharging the first and second input/output nodes to the predetermined voltage level.

20. The method of claim 16, further comprising negating the body control signal prior to sensing the read access.

* * * * *